(12) United States Patent (10) Patent No.: US 8,231,933 B2
Takeshita et al. (45) Date of Patent: Jul. 31, 2012

(54) METHOD FOR MANUFACTURING ORGANIC ELECTROLUMINESCENCE DEVICE

(75) Inventors: Koji Takeshita, Tokyo (JP); Takahisa Shimizu, Tokyo (JP); Hironori Kawakami, Tokyo (JP); Nahoko Inokuchi, Tokyo (JP); Tomoaki Fukuhara, Tokyo (JP); Hiroshi Matsuzawa, Tokyo (JP)

(73) Assignee: Toppan Printing Co., Ltd. (JP)

( * ) Notice: Subject to any disclaimer, the term of this patent is extended or adjusted under 35 U.S.C. 154(b) by 1024 days.

(21) Appl. No.: 12/140,222

(22) Filed: Jun. 16, 2008

(65) Prior Publication Data

US 2008/0311284 A1 Dec. 18, 2008

(30) Foreign Application Priority Data

Jun. 18, 2007 (JP) .................. 2007-160176

(51) Int. Cl.
*B05D 1/28* (2006.01)
*B05D 5/12* (2006.01)
(52) U.S. Cl. .................. 427/66; 427/428.06; 427/428.2
(58) Field of Classification Search .................. 427/66, 427/428.06, 428.2
See application file for complete search history.

(56) References Cited

U.S. PATENT DOCUMENTS

| | | | |
|---|---|---|---|
| 6,582,504 B1 | 6/2003 | Fujita | |
| 2006/0220537 A1* | 10/2006 | Takeshita et al. | 427/66 X |
| 2007/0175349 A1* | 8/2007 | Konaka et al. | 101/425 |

FOREIGN PATENT DOCUMENTS

| | | |
|---|---|---|
| JP | 08-216372 | 8/1996 |
| JP | 11-227151 | 8/1999 |
| JP | 2001-093668 | 4/2001 |
| JP | 2001-155858 | 6/2001 |
| JP | 2001-155861 | 6/2001 |
| JP | 2006-252787 | 9/2006 |
| JP | 2006286241 A * | 10/2006 |
| JP | 2007-294280 A * | 11/2007 |

OTHER PUBLICATIONS

Notification of Reason for Refusal from JPO for Appl. No. 2007-160176, mailed Nov. 11, 2011, 2 pgs.
Translation of Notification of Reason for Refusal from JPO for Appl. No. 2007-160176, mailed Nov. 11, 2011, 4 pgs.

* cited by examiner

*Primary Examiner* — Leo B Tentoni
(74) *Attorney, Agent, or Firm* — Squire Sanders (US) LLP

(57) ABSTRACT

One embodiment of the present invention is a method for manufacturing an organic electroluminescence device, including forming an organic light emitting layer by a relief printing method, the method including transferring an organic light emitting material ink from an ink supplier to a printing plate, and subsequently transferring the organic light emitting material ink from the printing plate to a substrate, wherein a solvent of the organic light emitting material ink comprises a solvent having a vapor pressure over 500 Pa at 20-25 degrees Celsius, and wherein the time between the reception of the ink by the printing plate and the transfer of the ink to the substrate is equal to or less than 5 seconds.

6 Claims, 2 Drawing Sheets

METHOD FOR MANUFACTURING ORGANIC
ELECTROLUMINESCENCE DEVICE

CROSS REFERENCE

This application is based upon and claims the benefit of priority from the prior Japanese Patent Application No. 2007-160176, filed on Jun. 18, 2007, the entire contents of which are incorporated herein by reference.

BACKGROUND OF THE INVENTION

1. Field of the Invention

The present invention is related to a method for manufacturing an organic electroluminescence (EL) device. In particular, the present invention is related to a method for manufacturing an organic EL device by a relief printing method.

2. Description of the Related Art

In an organic EL device, a light-emitting layer comprising an organic light-emitting material is formed between a pair of opposing electrodes, and light emission is induced by passing an electric current to the light-emitting layer. In order to emit light with good efficiency, the thickness of the light-emitting layer plays an important role and the layer has to be formed as a thin film with a thickness of about 100 nm. Further, it has to be patterned with a high degree of accuracy to produce a display.

A low molecular material and a high molecular material can be used as the organic light emitting material for forming the light emitting layer. The low molecular material is subjected to resistive heating vapor deposition and the like to form a thin film, and at the same time the patterning is performed by using a microscopically patterned mask. However, this method has a problem in that patterning accuracy is reduced with an increase in the size of a substrate.

Therefore, the high molecular material has recently been used as the organic light emitting material, and a method of forming a thin film by wet coating with a coating liquid obtained by dispersing or dissolving the organic light emitting material into a solvent has been attempted. As the wet coating method for the thin film formation, spin coating, bar coating, projection coating, dip coating, and the like are known. However, the wet coating methods have difficulty in realizing the high definition patterning and color coding with R, G, and B, and it is considered that the thin film is most effectively formed by a printing process that is capable of achieving excellent color coding and patterning.

Further, among various printing processes, the gravure printing and like methods in which a hard plate such as a metal printing plate is used are not suitable for the organic EL device and a display that have a glass substrate. The offset printing using an elastic rubber blanket and a relief process using an elastic rubber plate or resin plate are appropriate for the organic EL device and a display. As attempts on the printing processes, a method employing the offset printing (see Patent Publication 1) and a method employing the relief process (see Patent Publication 2) and so on have been proposed.

Meanwhile, the high molecular organic light emitting material has a low solubility to water and alcohol-based solvents, and it is necessary to use an organic solvent for obtaining a coating liquid (hereinafter referred to as ink) from the high molecular organic light emitting material. An aromatic system organic solvent is suitably used as the organic solvent. Therefore, the ink made from the organic light emitting material (hereinafter referred to as organic EL ink) is an ink of organic solvent.

However, the rubber blanket used in the offset printing is subject to swelling and deformation due to the organic solvent such as toluene or xylene. Though various rubbers such as an olefin-based rubber and a silicone-based rubber can be used for the blanket, the rubbers do not have resistance to the toluene solvent, the xylene solvent, and the like and are subject to swelling and deformation. Therefore, the rubbers are inadequate for printing the organic EL ink.

Also, a flexographic printing process using a plate made from a rubber and a resin relief printing process using a resin plate without a rubber component are included in the relief printing process using an elastic relief plate, and a process using a water-developable resin relief plate, the plate having a water-solubility resin as a main component, is highly resistant to the organic solvents and can be used for the organic EL ink printing.

Due to the above reasons, the relief process using the water-developable photosensitive resin relief plate is the most suitable method of printing the organic EL ink made from the aromatic solvent such as toluene and xylene on the hard substrate such as the glass substrate.

An inking roller or an anilox roll is used for a general resin relief printing method using a resin relief printing plate. In an inking roller method, an ink having a relatively high viscosity is kneaded by a plurality of inking rollers. Ink transfer is repeated several times. Finally, an amount of an ink supplied to a relief printing plate becomes uniform. An anilox roll method is as follows: fine cells are formed on a surface of a roll; a liquid ink is supplied to the cell; an excess ink is removed by a doctor; thereby, a constant amount of an ink is supplied to a printing plate.

On the other hand, as mentioned above, the solubility of an organic light emitting material in an organic solvent is high. Especially, the solubility of an organic light emitting material in an aromatic system organic solvent is high. Therefore, an organic light emitting material is generally used as an aromatic system organic solvent ink. However, among aromatic system organic solvents, toluene or xylene has an aromatic ring with a relatively simple additional group. Therefore, as for toluene or xylene, the solubility of an organic light emitting material is high. Therefore, the concentration of solid content in an ink tends to be easily set. Separating or gelling of an organic light emitting material does not tend to occur. Further, among aromatic system organic solvents, the vapor pressure of toluene or xylene is high. That is, toluene or xylene is a solvent which easily dries. Therefore, a drying temperature can be set relatively low and because the amount of solvent remaining in a light emitting layer is small, toluene or xylele is preferred for an ink.

However, in the case where the vapor pressure is high (highly-volatile), an ink is easily dried during printing. In a relief printing, ink transfer occurs twice. That is, an ink is transferred from an anilox roll or an ink roll to a printing plate, and an ink is transferred form a printing plate to a substrate. In the case of a relief printing, if an ink is easily dried, an ink is easily dried during transfer of an ink. Therefore, a printing failure may occur. Therefore, an idea is proposed in which a printing failure due to drying is prevented by using a solvent having a low vapor pressure (patent document 3).

An ink in which a polymer organic light emitting material is dissolved in a solvent is used for an organic EL ink which is used for forming an organic light emitting layer by a relief printing method. However, if the solubility of an organic light emitting material is low, separating or gelling of a solid component occurs. Then, as mentioned above, if an aromatic system organic solvent is used as a solvent, the solubility of an organic light emitting material becomes high. Thereby, an ink is obtained in which separating or gelling of a solid component does not easily occur. In this case, as for toluene or xylene having a relatively high vapor pressure among aromatic system organic solvents, especially the solubility of an organic light emitting material is high. The solid content can be widely adjusted. In addition, since the vapor pressure is high, a drying temperature can be low while the amount of remaining solvent is small. Therefore, toluene or xylene is preferred. However, as also mentioned above, because an ink including toluene or xylene as a solvent dries quickly, ink drying easily occurs during transfer of the ink, causing a printing failure.

Then, the objective of the present invention is to provide a method for manufacturing an organic EL device. In the method, a light emitting layer can be preferably formed by a relief printing method. In the method, a printing method is used in which a printing failure due to drying of an ink does not occur even if an aromatic system organic solvent such as toluene or xylene having a vapor pressure over 500 Pa at a general room temperature, in which a solubility of an organic light emitting material is high, is used.

In order to achieve the objective, the inventors found that the following method is effective. In the method, a printing failure due to drying of an ink does not occur even if an aromatic system organic solvent such as toluene or xylene having a vapor pressure over 500 Pa at a usual room temperature (20-25 degrees Celsius), in which solubility of a polymer organic EL material is high, is used.

[Patent document 1] JP-A-2001-93668
[Patent document 2] JP-A-2001-155858
[Patent document 3] JP-A-2001-155861

SUMMARY OF THE INVENTION

One embodiment of the present invention is a method for manufacturing an organic electroluminescence device, including forming an organic light emitting layer by a relief printing method, the method including transfer of an organic light emitting material ink from an ink supplier to a printing plate, and subsequently transferring the organic light emitting material ink from the printing plate to a substrate, wherein a solvent of the organic light emitting material ink comprises a solvent having a vapor pressure over 500 Pa at 20-25 degrees Celsius, and wherein the time between the reception of the ink by the printing plate and transfer of the ink to the substrate is equal to or less than 5 seconds.

In these drawings, 1 is a glass cap; 2 is a cathode; 3 is a light emitting layer; 4 is a hole transport layer; 5 is a pixel electrode; 6 is a glass substrate; 7 is an insulating layer; 8 is a printing plate cylinder; 9 is a printing plate; 10 is a doctor blade; 11 is an anilox roll; 12 is an ink chamber; 13 is a substrate; and 14 is a stage.

DETAILED DESCRIPTION OF THE INVENTION

Figure 1:
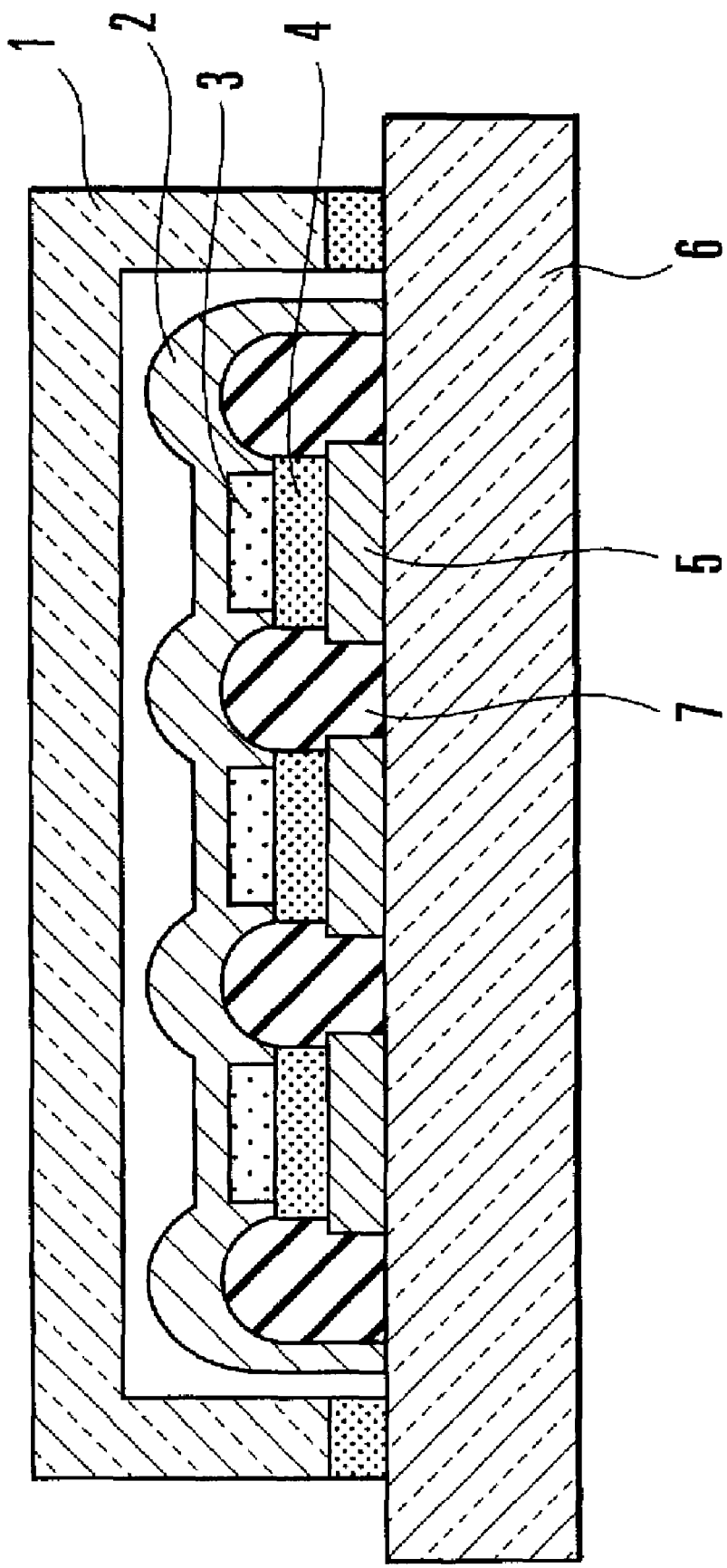
FIG. 1 is a cross-sectional schematic diagram of an organic EL device of the present invention, the device constituting an organic EL display.

One embodiment of the present invention is described. That is, a case where a light emitting layer of a passive matrix type organic EL display panel is formed by a relief printing method is described. However, the present invention is not limited to this case. For example, the present invention can be used for a method for forming an organic layer pattern. FIG. 1 shows a schematic cross-sectional diagram of an organic EL device of one embodiment of the present invention, the device constituting an organic EL display.

An organic EL device constituting an organic EL display panel is formed on a glass substrate 6. Pattern-formed pixel electrodes 5 are formed on the glass substrate 6 as anodes. Transparent electrode materials such as ITO (indium tin complex oxide), IZO (indium zinc complex oxide), tin oxide, zinc oxide, indium oxide and aluminium zinc complex oxide can be used as materials for the pixel electrodes 5. In addition, the electrical resistance of ITO is low and ITO has a solvent resistance and is transparent. Therefore, ITO is preferable. ITO is formed on the glass substrate by a sputter method. Patterning of ITO is performed by a photolithography method and in this way ITO becomes line-shaped pixel electrodes 5.

An insulating layer 7 is formed between adjacent pixel electrodes 5 by a photolithography method using a photosensitive material after line-shaped pixel electrodes 5 have been formed.

After insulating layer 7 is formed, hole transport layer 4 is formed. Examples of hole transport materials which form hole transport layer 4 include poly aniline derivative, poly thiophenes, polyvinylcarbazole (PVK) derivative and poly(3,4-ethylenedioxy thiophene) (PEDOT). These materials are mixed with or are added to a polymer such as polystyrene sulfonate (PSS). Thereafter, these materials are dissolved or dissolved in a solvent to form a hole transport ink. A hole transport layer can be formed by applying the hole transport ink on the entire surface of a substrate with a pixel electrode and an insulating layer. In addition, a hole transport layer is formed by applying the hole transport ink in each pixel in accordance with a pixel electrode pattern using a relief printing method.

After a hole transport layer 4 is formed, an organic light emitting layer 3 is formed. Examples of organic light-emitting materials for forming the organic light emitting layer 3 include 1. organic light-emitting materials in which light emitting color materials such as coumarin system, perylene system, pyran system, anthrone system, porphyrin system, quinacridone system, N,N'-dialkyl-substituted quinacridone system, naphthalimide system, N,N'-diaryl-substituted pyrrolopyrrole system and iridium complexes are dispersed in polymers such as polystyrene, polymethyl methacrylate and polyvinyl carbazole, 2. and polymeric organic light-emitting materials of polyarylene system, polyarylene vinylene system and polyfluorene system.

An organic light emitting material ink is made by dissolving these organic light emitting materials in a solvent. The solvent used for dissolving the organic light emitting material is a solvent having a vapor pressure over 500 Pa at 20-25 degrees Celsius. Toluene, xylene, acetone, methyl ethyl ketone, methyl isobutyl ketone, cyclohexanone and the like can be used. These solvents may be used alone or these combined solvent may be used. Above all, an aromatic organic solvent such as toluene and xylene is preferred from the aspect of the solubility of an organic light emitting material.

An organic light emitting layer is formed by a relief printing method so that different color layers are separately formed. A water-developable type resin relief printing plate, the plate being highly resistant to a solvent, is used for a printing plate. An example of a water-developable type photosensitive resin includes a type comprised of a hydrophilic polymer, a monomer including an unsaturated bond (so-called, cross-linkable monomer) and a photoinitiator. In this type, polyamide, polyvinyl alcohol, cellulosic or the like is used for a hydrophilic polymer. In addition, for example, methacrylate including a vinyl bond is used for a cross-linkable monomer. For example, an aromatic carbonyl compound is used for a photoinitiator. Among the above, the polyamide-based water-developable photosensitive resin is suitably used in view of printability.

Figure 2:
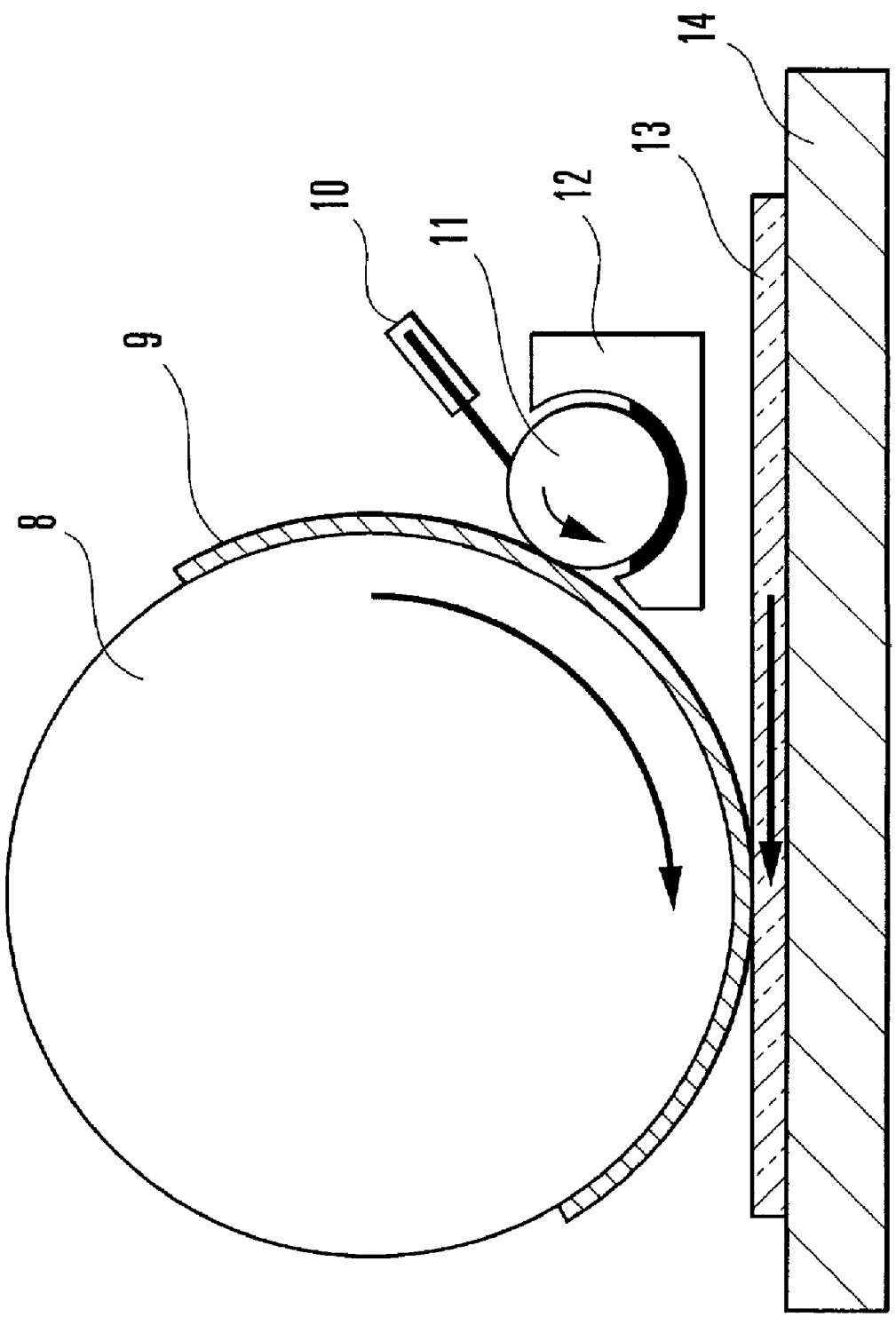
FIG. 2 is a schematic diagram of one example of a relief printing apparatus which can be used in the present invention.

A flexo printing apparatus for printing ink on a flat substrate can be used as a printing apparatus for forming an organic light emitting layer. However, a printing apparatus described below is preferred. In order to achieve the objective of the present invention, an ink supplier which supplies an ink to a printing plate has a structure described below. FIG. 2 shows a schematic diagram of a printing apparatus. An ink supplier of this printing apparatus has an anilox roll 11 and an ink holding part (hereinafter, this part is called an ink chamber 12). Part of the anilox roll is always immersed in the ink inside an ink chamber 12. The ink supplier is arranged so that a printing plate 9 placed on a printing plate cylinder 8 is in contact with the anilox roll 11. The ink was supplied to a printing plate 9 while the printing plate cylinder 8 rotates in accordance with a rotation of the anilox roll 11. In addition, while the printing plate cylinder 8 performs a 360-degree rotation, the ink is supplied to the printing plate 9, and the ink was transferred to a substrate 13 on a stage 14. An organic light emitting material ink is taken to an ink tank. The organic light emitting material ink is sent into the ink chamber 12 from the ink tank. The anilox roll 11 is arranged so that part of the anilox roll 11 rotates and is always immersed in the ink inside the ink chamber 12. That is, the anilox roll 11 is always supplied with the ink. In addition, since the anilox roll 11 rotates in contact with the printing plate cylinder 8 during printing, the anilox roll 11 can supply the ink to the printing plate.

Processes in which an ink is transferred by the above mentioned ink supplier are described below. The anilox roll 11 has a fine cell structure on a surface of the roll. The cell holds an organic light emitting material ink. Part of the anilox roll is immersed in the ink while the roll rotates. At this time, excess ink is removed by a doctor blade 10. Thereby, the ink is uniformly supplied to a surface of the anilox roll 11. Next, the anilox roll 11 rotates in contact with the printing plate cylinder 8. Therefore, the anilox roll 11 is in contact with the printing plate 9 by a rotation of the printing plate cylinder 8 during printing. Thereby, the ink is transferred from the anilox roll to a surface of the printing plate 9. The ink supplied to a surface of the printing plate 9 is transferred to the substrate 13 in the same single rotation as the rotation in which the printing plate 9 is supplied with the ink from the anilox roll 11.

In the present invention, it is necessary that the time between the "time point when a printing plate 9 receives an organic light emitting material ink from an anilox roll 11" and the "time point when the ink is transferred to a substrate 13" is equal to or less than 5 seconds. In the case where the time is less than 5 seconds, drying of the ink is controlled, and a printing failure does not occur. In a more preferable embodiment of the present invention, the time between the "time point when an organic light emitting material ink is supplied to an anilox roll 11" and the "time point when the ink is transferred to an substrate" is equal to or less than 5 seconds. In addition, here, the "time point when an organic light emitting material ink is supplied to an anilox roll 11" means the "time point when an anilox roll is separated from a surface of an ink for immersion". In the most preferable embodiment of the present invention, the time between the "time point when an organic light emitting material ink is supplied to an anilox roll 11" and the "time point when the ink is transferred to a substrate" is equal to or less than 2 seconds. In these preferred embodiments, drying of an ink during transfer of an ink is further controlled.

After having formed organic light emitting layer 3, a line pattern cathode layer 2 which is perpendicular to line pattern pixel electrodes is formed. The material of a cathode layer which is suitable for the light emitting property of an organic light emitting layer can be used. For example, metal simple substance such as lithium, magnesium, calcium, ytterbium and aluminium can be used. An alloy of the above mentioned metal simple substance and the stable metal such as gold and silver can be used. In addition, conductive oxidate of indium, zinc, tin or the like can be used. A vacuum evaporation method using a mask can be used as a formation method of a cathode layer. Finally an organic electroluminescent device is sealed using a glass cap 1 and an adhesive to protect the organic electroluminescent device from outside oxygen and moisture. An organic electroluminescent display panel can be obtained in this way.

In the present invention, even if an aromatic system organic solvent such as toluene or xylene having a vapor pressure over 500 Pa at a general room temperature, in which the solubility of an organic light emitting material is high, is used, a printing failure due to drying of an ink does not occur. Therefore, a method for manufacturing an organic EL device is provided in which a light emitting layer can be preferably formed by a relief printing method.

EXAMPLES

Hereinafter, examples of the present invention are described. However, the present invention is not limited to the examples.

Example 1

The following organic light emitting ink was prepared. The polyphenylene vinylene derivative which was an organic light emitting material was dissolved in toluene. The concentration of a polyphenylene vinylene derivative was 1%. This organic light emitting ink was printed by a relief printing method and a light emitting layer was formed. In addition, an ink supplier of a printing apparatus had an anilox roll and an ink chamber. A part of the anilox roll was always immersed in the ink chamber. The ink supplier was arranged so that a printing plate placed on a printing plate cylinder was in contact with the anilox roll. An ink was supplied to the printing plate while the printing plate cylinder rotated in accordance with a rotation of the anilox roll. In addition, while the printing plate cylinder performed a 360-degree roll, an ink was supplied to the printing plate, and the ink was transferred to a substrate. Therefore, the time between the time point when the ink is supplied to the anilox roll and the time point when the ink is transferred to the substrate through the printing plate can be significantly reduced. In the actual printing condition, the time was between 1 second and 2 seconds. The calculated time was 1.8 seconds. The vapor pressure of toluene which was used as a solvent of the ink was about 2900 Pa at 20 degrees Celsius, and 3800 Pa at 25 degree Celsius. In printing of a light emitting layer, a line-patterned light emitting layer is formed on a line-patterned pixel electrode so that both lines matched with each other. The relief printing plate which was used was a water-developable photosensitive resin relief printing plate which was highly resistant to an aromatic system organic solvent. An anilox roll had 150 lines/inch.

Other information relating to a method for manufacturing an organic EL device in Example 1 is described in detail. A sputter method was used and ITO thin film was formed on a glass substrate of 300 mm square. The ITO film was patterned by a photolithography method and etching by an acid solution. Pixel electrodes for two display units of which a diagonal size was 5 inches were formed. A line pattern of pixel electrodes for one display unit is described below. The line width was 80 μm. The space was 40 μm and the number of lines was 840. Thereupon, a hole transport layer was formed by a slit coat method. A water dispersion liquid of PEDOT/PSS was used as a hole transport material ink. The film thickness of the hole transport layer after drying was 50 nm. A light emitting layer thereupon was formed by the above mentioned method. The film thickness of an organic light emitting layer after printing and drying was 80 nm. Thereupon, a cathode layer comprising Al and Ca was formed. A mask evaporation method by resistance heating evaporation method was applied to the cathode layer which was formed as a line pattern. The line-shaped cathode layer is perpendicular to the line pattern of anode electrodes. A glass cap and adhesive were used, and the organic electroluminescent assembly was sealed last to protect the organic EL assembly from external oxygen and moisture. In this way, the organic EL display panel was obtained. In addition, after a light emitting layer was printed, the solvent remaining in a light emitting layer was evaluated using a sample prepared separately.

Example 2

An organic EL device was manufactured by the same method as Example 1 except that o-xylene was used for a solvent of an organic light emitting material ink. The vapor pressures of o-xylene were about 650 Pa at 20 degrees Celsius and about 830 Pa at 25 degrees Celsius.

Example 3

An organic EL device was manufactured by the same method as Example 2 except that the time between the "time point when an ink was supplied to an anilox roll" and the "time point when an ink was finally transferred to a substrate through a printing plate" was 5 seconds.

Comparative Example 1

An organic EL device was manufactured by the same method as Example 1 except that anisole was used for a solvent of an organic light emitting material ink. The vapor pressures of anisole were about 330 Pa at 20 degrees Celsius and about 470 Pa at 25 degrees Celsius.

Comparative Example 2

An organic EL device was manufactured by the same method as Example 1 except that aniline was used for a solvent of an organic light emitting material ink. The vapor pressures of anisole were about 57 Pa at 20 degrees Celsius and about 85 Pa at 25 degrees Celsius.

Comparative Example 3

An organic EL device was manufactured by the same method as Example 2 except that the time between the "time point when an ink was supplied to an anilox roll" and the "time point when an ink was finally transferred to a substrate through a printing plate" was 8 seconds (the time between the time point when a printing plate received an ink and the time point when an ink was transferred to a substrate was 6 seconds). The vapor pressures of o-xylene were about 650 Pa at 20 degrees Celsius and about 830 Pa at 25 degrees Celsius.

TABLE 1

| | Solvent of ink | Vapor pressure Pa (20 degrees Celsius/ 25 degrees Celsius) | Transfer time of ink (s) | Remaining solvent | Printing characteristics |
| --- | --- | --- | --- | --- | --- |
| Example 1 | Toluene | 2900/3800 | 1.8 | ○ | ○○ |
| Example 2 | o-xylene | 650/820 | 1.8 | ○ | ○○ |
| Example 3 | o-xylene | 650/820 | 5 | ○ | ○ |
| Comparative Example 1 | anisole | 330/470 | 1.8 | Δ | ○ |
| Comparative Example 2 | aniline | 57/85 | 1.8 | x | ○ |
| Comparative Example 3 | o-xylene | 650/820 | 8 | ○ | x |

Printing characteristics (printing position accuracy)
○○: very good
○: good
x: bad
Remaining solvent
○: not detected at all.
Δ: slightly detected.
x: detected.

Table 1 shows the following results: in the cases of Example 1-3 and Comparative Example 3 where toluene or xylene was used for a solvent of an ink, solvent remaining in a light emitting layer after printing/drying was not detected; on the other hand, in the cases of Comparative Example 1 and 2 where anisole or aniline was used for a solvent of an ink, remaining solvent was detected. In addition, in the cases of Example 1-3 and Comparative Example 1 and 2 where transfer time of an ink was 2-5 seconds, printing characteristics were good. On the other hand, in the case of Comparative Example 3 where transfer time of an ink was 8 seconds, failure in ink transfer due to ink drying during printing was observed. In the transfer time of an ink of 2-5 seconds, the case of 2 seconds was preferred. From these results, the following fact was confirmed: in Example 1-3, printing was good. That is, there was little solvent remaining in a light emitting layer, and a transfer failure did not occur when an easily drying solvent such as toluene or xylene having a vapor pressure over 500 Pa was used, and transfer time of an ink was 5 seconds or less.

INDUSTRIAL APPLICABILITY

A manufacturing method of the present invention provides a printing method. In the printing method, if an aromatic system organic solvent having a vapor pressure over 500 Pa at a general room temperature, examples of the solvent being toluene or xyline in which solubility of an organic light emitting material is high, a printing failure due to drying does not occur. Therefore, it is possible to form a good light emitting layer by a relief printing method. The method is useful as a method for manufacturing an organic EL device.

What is claimed is:

1. A method for manufacturing an organic electroluminescence device comprising:
    forming an organic light emitting layer by a relief printing method, the method comprising:
    transferring an organic light emitting material ink from an ink supplier to a printing plate; and
    subsequently transferring the organic light emitting material ink from the printing plate to a substrate, wherein a solvent of the organic light emitting material ink comprises a solvent having a vapor pressure over 500 Pa at 20-25 degrees Celsius, and wherein the time between reception of the ink by the printing plate and the time of transferring the ink to the substrate is equal to or less than 5 seconds.

2. The method for manufacturing an organic electroluminescence device according to claim 1, wherein the time between the point when the organic light emitting material ink is supplied to the ink supplier and the point when the ink is transferred to the substrate is equal to or less than 5 seconds.

3. The method for manufacturing an organic electroluminescence device according to claim 1, wherein the time between the point when the organic light emitting material ink is supplied to the ink supplier and the point when the ink is transferred to the substrate is equal to or less than 2 seconds.

4. The method for manufacturing an organic electroluminescence device according to claim 1, wherein the ink supplier includes an anilox roll and an ink chamber, wherein part of the anilox roll is always immersed in the organic light emitting ink in the ink chamber, wherein the printing plate on a printing plate cylinder is in contact with the anilox roll, wherein the anilox roll rotates in accordance with the rotation of the printing cylinder while the ink is supplied to the printing plate, and wherein ink supplying to the printing plate and ink transferring to the substrate are performed in one rotation of the printing plate cylinder.

5. The method for manufacturing an organic electroluminescence device according to claim 1, wherein the printing plate is a water developable type photosensitive resin relief printing plate.

6. A method for manufacturing an organic layer pattern, comprising:
    forming an organic layer pattern by a relief printing method, the method comprising:
    transferring an organic material ink from an ink supplier to a printing plate; and
    subsequently transferring the organic material ink from the printing plate to a substrate, wherein a solvent of the organic material ink includes a solvent having a vapor pressure over 500 Pa at 20-25 degrees Celsius, and wherein the time between the reception of the ink by the printing plate and the transfer of the ink to the substrate is equal to or less than 5 seconds.

* * * * *